United States Patent [19]
Takahashi et al.

[11] Patent Number: 5,236,547
[45] Date of Patent: Aug. 17, 1993

[54] METHOD OF FORMING A PATTERN IN SEMICONDUCTOR DEVICE MANUFACTURING PROCESS

[75] Inventors: Shigeki Takahashi, Kawasaki; Yasuhiro Shiraki, Tokyo, both of Japan

[73] Assignee: Kabushiki Kaisha Toshiba, Kawasaki, Japan

[21] Appl. No.: 765,518

[22] Filed: Sep. 25, 1991

[30] Foreign Application Priority Data

Sep. 25, 1990 [JP] Japan .................. 2-254885
Jan. 8, 1991 [JP] Japan .................. 3-11480
Aug. 16, 1991 [JP] Japan .................. 3-205737

[51] Int. Cl.$^5$ .................................. H01L 21/00
[52] U.S. Cl. .................................. 156/628; 156/643; 156/646; 156/657; 156/662; 437/225; 437/233; 437/234; 437/3; 437/4; 437/5
[58] Field of Search ............ 156/646, 628, 643, 662, 156/657; 437/228, 3-5, 225, 233, 234; 430/311, 325, 323

[56] References Cited

U.S. PATENT DOCUMENTS

| | | | |
|---|---|---|---|
| 4,377,734 | 3/1983 | Mashiko et al. | 156/628 X |
| 4,514,251 | 4/1985 | van Ommen et al. | 156/628 |
| 5,074,955 | 12/1991 | Henry et al. | 156/662 X |

FOREIGN PATENT DOCUMENTS

58-164226 9/1983 Japan .
59-184528 10/1984 Japan .................. 156/628
61-84832 4/1986 Japan .

OTHER PUBLICATIONS

Hinkel et al, "Method of Influencing the Etch Rate of PECVD Films and Application of the Method", IBM Technical Disclosure Bulletin, vol. 24, No. 11B, Apr. 1982.
J. Vac. Sci. Technol., vol. 19, pp. 1379-1384, Nov./Dec. 1981 Venkatesan et al: "Plasma-developed ion-implanted resists . . ."
J. Vac. Sci. Technol., vol. 133, pp. 879-883, May/Jun. 1985 Milgram et al: "A bilevel resist for ion beam lithography".
Appl. Phys. Lett., vol. 57, pp. 1672-1674.
Wang et al: "Vacuum lithography for in situ fabrication of . . . ".

Primary Examiner—Thi Dang
Attorney, Agent, or Firm—Oblon, Spivak, McClelland, Maier & Neustadt

[57] ABSTRACT

In a method of forming a pattern in semiconductor device manufacturing process, a thin film consisting of a silicon nitride film is formed on a substrate. Ga ions are implanted by a focussed ion beam into a selected region of the thin film. At this point, a pattern to be formed is defined by the selected region. Subsequently, the thin film is dry etched by $CF_4$. At this point, the selected region into which the ions are implanted functions as an etching inhibition region.

20 Claims, 12 Drawing Sheets

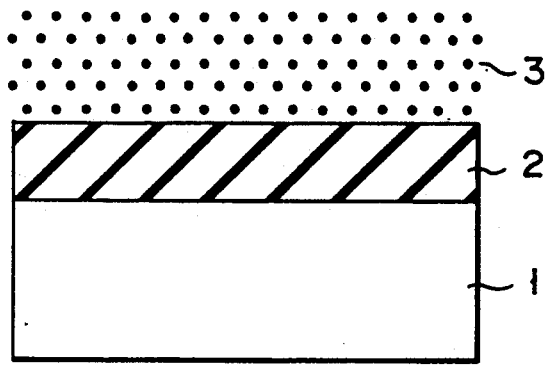
F I G. 1A
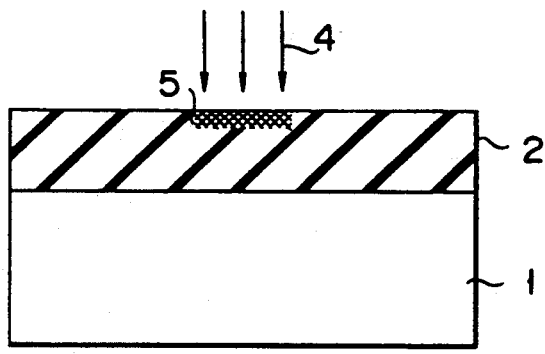
F I G. 1B
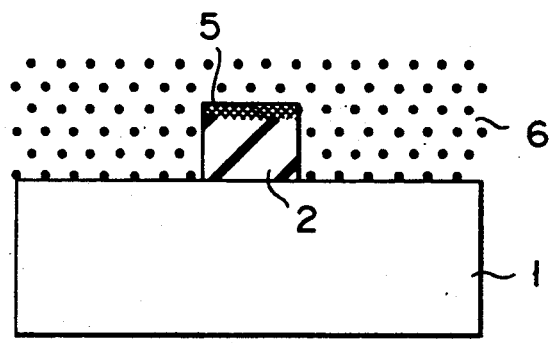
F I G. 1C

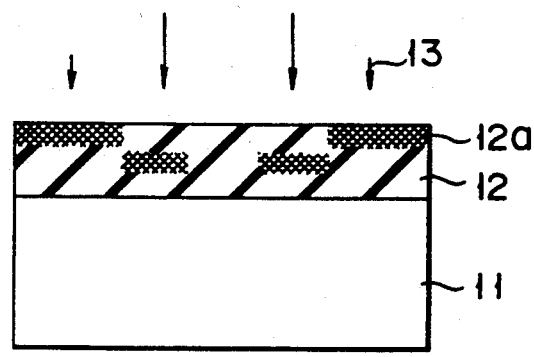
F I G. 2A
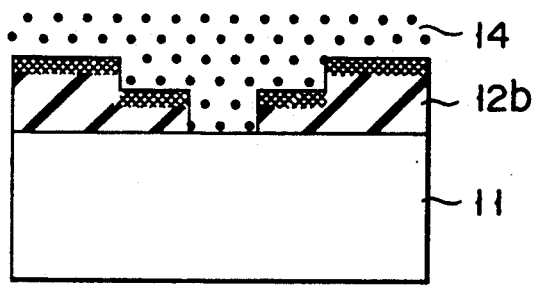
F I G. 2B

F I G. 6A
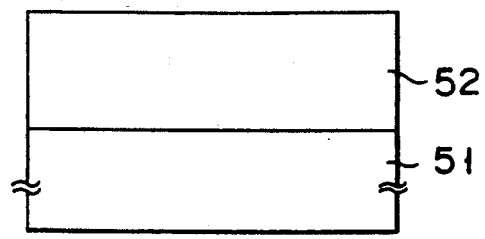
F I G. 6B
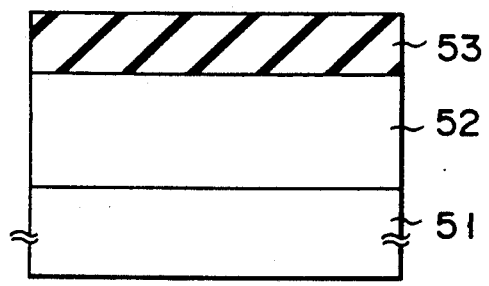
F I G. 6C
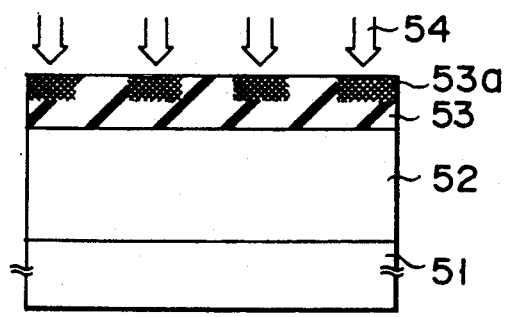
F I G. 6D
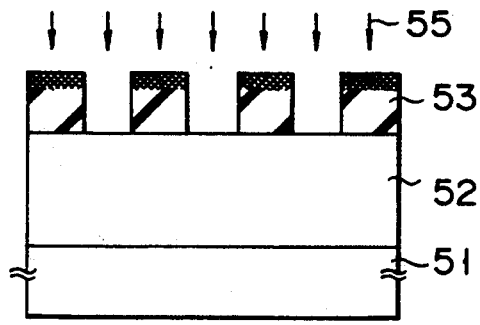

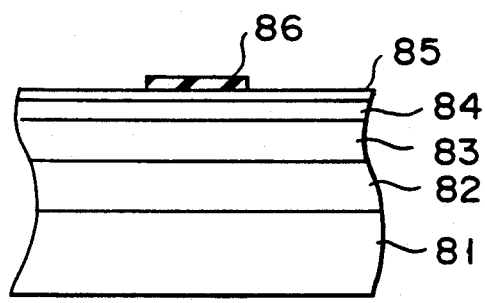
F I G. 8A
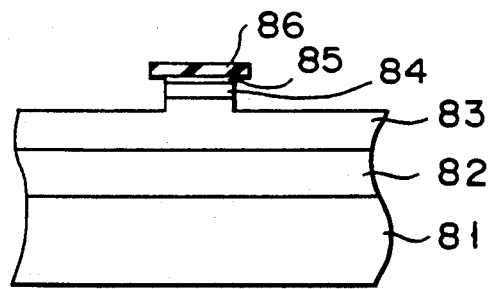
F I G. 8B
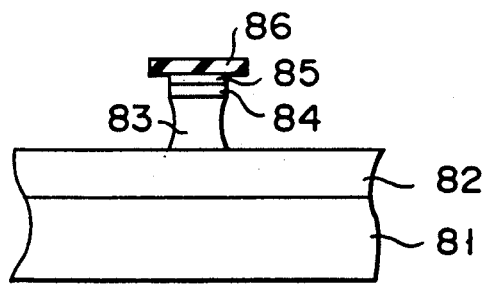
F I G. 8C

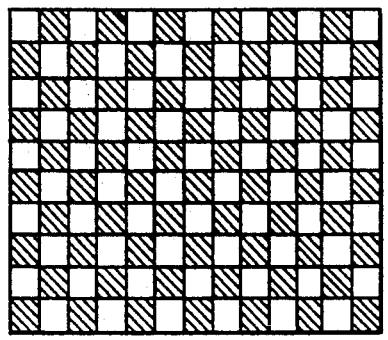
$$\frac{\lambda}{2(n_1+n_2)}$$
F I G. 9A
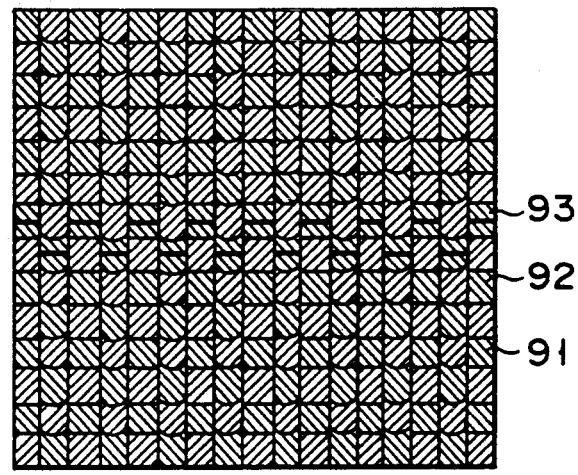
F I G. 9B

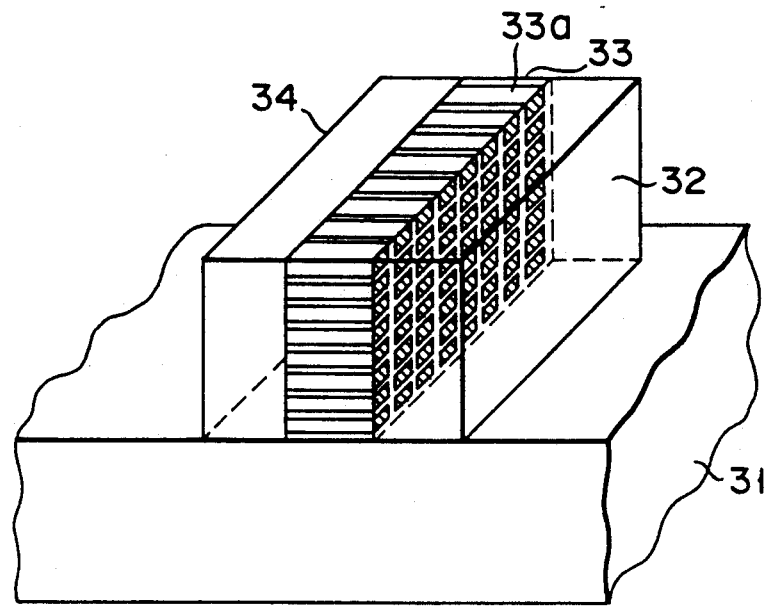
F I G. 10
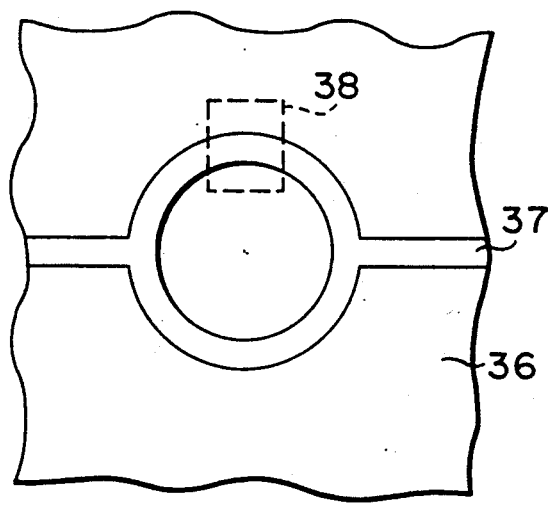
F I G. 11

METHOD OF FORMING A PATTERN IN SEMICONDUCTOR DEVICE MANUFACTURING PROCESS

BACKGROUND OF THE INVENTION

1. Field of the Invention

The present invention relates to a method of forming a pattern in semiconductor device manufacturing process, and more particularly to a method of forming a pattern having a step difference on an insulator, a semiconductor substrate, and a semiconductor multilayer film formed on the semiconductor substrate and the like, and to a method of manufacturing a microstructural semiconductor device such as a quantum wire laser and a mesoscopic device, where fabrication is performed on a compound semiconductor substrate, and then a compound semiconductor is allowed to crystal grow to manufacture a semiconductor device.

2. Description of the Related Art

Lithography technique is essential for forming a pattern of a semiconductor device, so that a lithography with a simple and better controllability has been required. With respect to the achievement of high integration and of high function, a method using electron beam, ion beam and the like by which a micropatterning can be performed is more effective than the lithography using an ordinary UV light. For example, a literature by A. Milgram et al., J. Vac. Sci. Technol. B3, 879 (1985) describes an example of a micropatterning using FIB (Focused Ion Beam).

Although that method allows a resist mask to be formed on a semiconductor substrate, an SOG film and an organic photoresist film have been formed by a process such as spin coat and baking which are difficult to use in the vacuum, so that such method has not been adapted to the achievement of a composite process, thus to an integrated vacuum process.

In patterning an oxide film and the like on a substrate, not limited to a mask for substrate etching, the above-mentioned resist mask must be formed. As with the above, this case also has not been adapted to an integrated vacuum process.

Thus, the unadaptability of the method to an integrated vacuum process has caused productivity to be reduced, and dust adhering and native oxide film development to occur in a pattern, thereby having caused the reliability of a device finally produced to be lowered.

The step difference pattern for semiconductor substrates and the like has been used for part of many semiconductor devices, so that a method of forming such pattern with a simple and better controllability has been required. For example, a literature by H. Morimoto et al., J. Vac. Sci. Technol. B5, 211 (1987) describes an example of a technique of forming a T-shaped step difference pattern on an organic polymer resist to produce a mushroom gate of GaAs MESFET.

In the method of forming the pattern having a step difference and a T-shaped section by the use of such organic polymer resist, the resist is not suitable for a vacuum process, so that there have been a problem with respect to process consistency, and also another problem with respect to productivity such that a complex process is required to reduce a damage at the time of ion beam exposure.

A literature by O. Wada, J. Electrochem. Soc., Solid-State Sci. Technol. 131, 2373 (1984) describes an example of a technique of forming a monolithic lens on an LED substrate side to improve a light coupling efficiency of LED and optical fiber.

In the method of forming the lens of LED by the use of such resist mask, inclined patterns having difference pattern sizes cannot be simultaneously formed, so that there have been a problem with respect to productivity, and also another problem with respect to process consistency because such resist mask is a material unsuitable for a vacuum process.

A microstructural semiconductor device has been tried to be applied to a high-performance semiconductor device including a quantum wire laser by the use of its quantum size effect and the like. A method of manufacturing a quantum wire laser is described, as an example, in a literature by M. Cao et al., Trans, IEICE, E73, 1. pp. 63-70 (January, 1990).

In the method of manufacturing the semiconductor device, PMMA resist and electron beam exposure used mainly for micropattern formation, as well as microfabrication technique combining wet etching hardly avoid a complexed manufacture process due to regrowth interface oxidation and impurity contamination, and a deteriorated device characteristics. Since the resist pattern has not a sufficient dry etching durability, there has been a limit of fabrication ability due to the use of wet etching.

SUMMARY OF THE INVENTION

It is therefore an object of the present invention to provide a method of forming a pattern capable of eliminating the above-mentioned disadvantages, of forming various patterns on a semiconductor substrate, and of achieving a composite process as an integrated vacuum process.

It is another object of the present invention to provide a semiconductor device having a structure which has a less interface deterioration and a good controllability for microfabrication.

In the first aspect of the present invention, a method of forming a pattern in semiconductor device manufacturing process comprises the steps of:

implanting Ga or In ions by a focused ion beam into a selected region of a thin film consisting of silicon nitride film or silicon oxide film, said selected region defining a pattern to be formed; and etching said thin film by dry etching of an etching gas containing F, using said selected region into which said ions have been implanted as an etching inhibition region.

In the second aspect of the present invention, a method of forming a pattern in semiconductor device manufacturing process comprises the steps of:

implanting ions into a film to be etched to form a plurality of high-ion concentration regions having different depths from the surface of said film; and etching said film from said surface using said high-ion concentration region as an etching inhibition region to form a step difference pattern on said film.

In the third aspect of the present invention, a method of forming a pattern in semiconductor device manufacturing process comprises the steps of:

forming a thin film of silicon or its compound on a compound semiconductor substrate;

implanting Ga or In ions by a focussed ion beam into a selected region of said thin film, said selected region defining a pattern to be formed;

etching said thin film by dry etching of an etching gas containing F, using said selected region of said thin film into which said ions have been implanted as an etching inhibition region; and dry etching the compound semiconductor substrate using the pattern of said thin film of silicon or its compound formed by said etching as a mask; wherein said each step is performed in a vacuum atmosphere and the transfer of the resulting structures between said steps is performed in a highly pressure reduced atmosphere According to the method of forming a pattern of the present invention, various patterns can be formed by a simple process. This allows a step difference pattern or an inclined pattern required for many semiconductor devices to be obtained by an integrated vacuum process, thereby providing a remarkable effect sufficient to improve productivity and the quality of semiconductor devices.

According to the method in the third viewpoint of the present invention, all important portions of the process of manufacturing microstructural semiconductor devices are performed in the vacuum, thereby allowing a deterioration of regrowth interface to be controlled to a less extent, with a result that a high-performance microstructural semiconductor device can be manufactured by a simple process. A process not limited to wet etching can be employed, thereby enhancing the controllability of microfabrication, with a result that a high-performance microstructural semiconductor device can be manufactured.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A through 1C are sectional views showing in the order of process a method of forming a pattern in connection with a first embodiment of the present invention;

FIGS. 2A and 2B are sectional views showing in the order of process a method of forming a step difference pattern in connection with a second embodiment of the present invention;

FIGS. 6A through 6H are sectional views showing part of a method of manufacturing a quantum wire laser in connection with a fourth embodiment of the present invention;

FIGS. 8A through 8C are sectional views showing part of a method of manufacturing a microcavity surface-emitting laser in connection with a sixth embodiment of the present invention;

FIGS. 9A and 9B are typical views of a three-dimensionally periodic dielectric structure in connection with a seventh embodiment of the present invention FIG. 10 is a typical view of a quantum wire photodetector device in connection with an eighth embodiment of the present invention;

FIG. 11 is a view to help explain a concept of an A-B effect device in connection with a ninth embodiment of the present invention;

DETAILED DESCRIPTION OF THE PREFERRED EMBODIMENTS

Figure 3A:
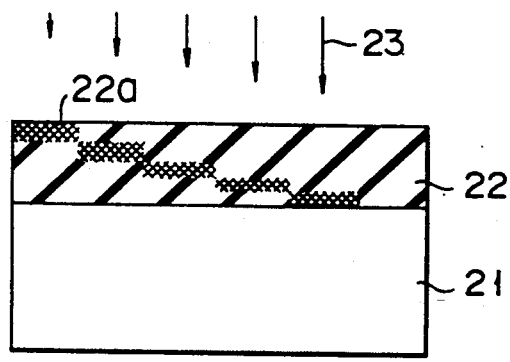
FIGS. 3A through 3C are sectional views showing in the order of process a method of forming an inclined pattern in connection with a third embodiment of the present invention.

With respect to a method of forming a mask pattern shown in FIG. 1, as shown in FIG. 1A, an $SiN_x$ film 2 as a mask material is first formed on a Si substrate 1 by a plasma enhanced CVD unit using $SiH_4$, $NH_3$ and $N_2$ as reactive gases. In FIG. 1A, numeral 3 indicates a plasma.

As a $SiN_x$, for example, $Si_3N_4$ or SiN is used. As a film forming condition at this point, assuming that a substrate temperature is 250° C., an RF output is 200 W, and a reactive gas flow ratio $SiH_4:NH_3:N_2$ is equal to 1:2:10, the $SiN_x$ film 2 with a thickness of approx. 800 nm is formed in a deposition time of 40 minutes.

Then, as shown in FIG. 1B a Ga ion 4 focussed with an acceleration voltage of 40 kV is selectively implanted into the $SiN_x$ film 2 by an FIB unit. At this point, the Ga ion is implanted into a region required to remain as a mask. In FIG. 1B, numeral 5 indicates an ion implanted region.

Then, as shown in FIG. 1C, the $SiN_x$ film 2 is dry etched by a radical 6 of $CF_4$ gas by the use of a microwave enhanced chemical-dry-etching (CDE) unit. At this point, the ion implanted region 5 becomes a mask by a later-mentioned reason to cause the $SiN_x$ film 2 to be selectively etched.

Thereafter, using remaining ion implanted region 5 without having been etched and its underlying $SiN_x$ film 2 as a mask, the substrate 1 can be selectively etched by dry etching.

A reason why the ion implanted region 5 acts as a mask will be explained here. In the $SiN_x$, $SiF_x$ becomes a reaction product by using an F-based radical, and the $SiF_x$ being volatile, is easily removed. On the other hand, in the ion implanted region 5, $GaF_x$ becomes a reaction product by using the F-based radical, and the $GaF_x$, being nonvolatile, remains without being removed. Accordingly, with the F-based radical, the ion implanted region 5 becomes a mask to cause the $SiN_x$ other than in the implanted region to be removed.

Figure 5:
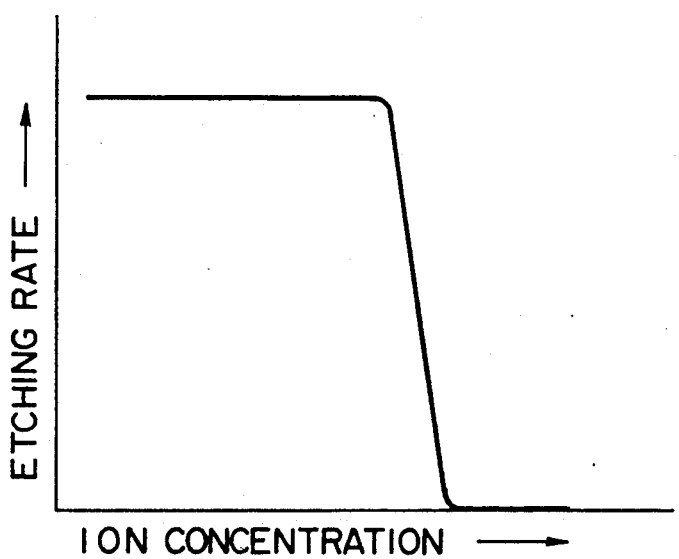
FIG. 5 is a chart showing an etching rate with respect to the ion concentration of an ion implanted region.

FIG. 5 shows a change of etch rate with respect to ion concentration of Ga. When an ion concentration implanted into the $SiN_x$ is larger than a certain value, etch rate becomes a very small value. This means that a region into which an ion is implanted exceeding a certain threshold becomes an etch stopping layer (mask). Although the threshold ion dose varies depending on $SiN_x$ film quality, Ga ion implanting condition and CDE condition, where Ga is implanted into said $SiN_x$ at 40 kV and CDE is performed with only $CF_4$ gas, etching speed becomes a very small in a region into which a dose of $10^{16}$ cm$^{-2}$ or more is implanted. Accordingly, the implanted into which an ion dose exceeding a threshold is implanted remains without being removed, thereby acting as a negative resist mask.

Thus, according to this embodiment, a $SiN_x$ mask can be formed on the substrate 1 without using a photoresist, SOG and the like. In this case, all processes can be performed in a condition of vacuum or close to vacuum, thereby allowing an integrated vacuum process and an improved productivity. No exposure of the substrate 1 to atmospheric air allows dust adhering and native oxide film development to be prevented, thereby improving the reliability of finally produced devices.

As shown in FIG. 1B, the Ga ion implanted has a peak of concentration on the upper portion of the $SiN_x$ film 2, whereby only the surface layer acts as an etch stopping layer, as shown in FIG. 1C. That is, because of surface imaging, with a micro beam of FIB, a micropattern can also be easily formed. In that case, replacing dry etching with RIE or ECR plasma enhanced RIBE effective in micropatterning allows a submicron patterning.

Figure 4:
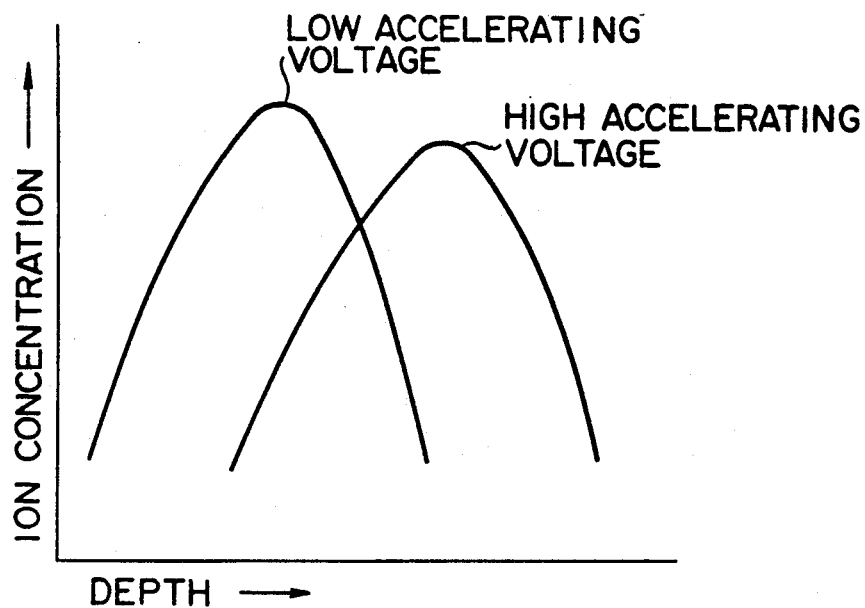
FIG. 4 is a chart showing a difference in ion concentration profile in terms of depth depending on different acceleration voltage.

With respect to a method of forming a step difference pattern in connection with a second embodiment of the present invention shown FIGS. 2A and 2B, as shown first in FIG. 2A, a $SiN_x$ film 12 with a thickness of approx. 500 nm is formed on a GaAs substrate 11 by using a plasma CVD unit, and a Ga ion 13 focussed by an FIB unit is implanted into the $SiN_x$ film 12. In order to form a step difference pattern at this step, the ion implantation is performed by moving an implantation position and changing an accelerating voltage. When an accelerating voltage is allowed to change in implanting an ion, as shown in FIG. 4, the profile of ion concentration in the depth direction will have a peak at a shallow depth for low acceleration and a peak at a deep depth for high acceleration. This causes, as shown with the crisscross lines in the $SiN_x$ film 12, ion implanted portions 12a to have a distribution with respect to the depth of ion concentration peak position, that is, step difference. Ion implantation is not performed for a region required to remove all the $SiN_x$ film 12. Then, the $SiN_x$ film 12 is dry etched by a radical 14 of $CF_4$ gas by the use of a chemical dry etching (CDE) unit as shown in FIG. 2B. When an ion concentration implanted is larger than a certain value, etching speed becomes a very small value, as shown in FIG. 5. This means that a region into which an ion is implanted exceeding a certain threshold becomes an etching stoppage layer (mask). Accordingly, the etching stoppage layer is distributed in the $SiN_x$ film 12 with a step difference, whereby the $SiN_x$ film 12 can be formed into a step-difference pattern 12b as shown in FIG. 2B.

In this embodiment, an ion beam is not radiated to the region where a material to be etched is completely removed, whereby no concern over a substrate ground damage due to ion beam irradiation becomes necessary. In the region which is irradiated with ion beam, most ions remain only in the upper portion of a required residual film thickness to form an etching blocking layer, whereby a substrate ground is not damaged. That is, the development by only one dry etching allows a patterning with less damage to be performed.

In this embodiment where $SiN_x$ film patterning is described, regarding the $SiN_x$ film as a mask, it will be apparent that processes such as electrode evaporation and lift off, and pattern transfer to a substrate by dry etching can be thereafter performed. GaAs or InP based semiconductor substrate, in particular, has a resistance against the dry etching of F based gas, so that there is lesser concern over substrate corrosion in patterning $SiN_x$ resist. On the contrary, in etching a substrate, an etching by Cl based gas allows the selection ratio of mask $SiN_x$ to substrate to take a large value, and at the same time, Ga included in the upper portion of the mask $SiN_x$ to be removed. Thereafter, a second dry etching by F based gas allows the entire mask $SiN_x$ to be ashing-removed. Thus, the $SiN_x$ formed in this embodiment can be freely used as an etching mask.

The $SiN_x$ used as a material to be etched in the above-mentioned first and second embodiments can be formed by not only plasma CVD, but by a vacuum process such as thermal CVD, sputtering using $SiN_x$ as a target, reactive sputtering using Si target and N based gas, E gun evaporation using $SiN_x$ as a source, and reactive E gun evaporation using Si source and N based gas. In a quite similar manner, $SiO_x$ can be formed as a material to be etched by a vacuum process, and as with the embodiments, a step difference pattern can be formed by FIB implanting Ga ion or In ion into it, and dry etching it with F based gas. Further, it will be apparent that, in addition to thin film, a Si based crystal substrate such as $SiN_x$ and $SiO_x$, and the Si substrate's self can be directly fabricated by a similar process. That is, the formation of Si based glass waveguide path and the window structure of multilayer film reflecting mirror can be easily performed.

Since C crystal as a material to be etched can be formed by a vacuum process such as CVD, and has a resistance against ion sputtering, a step difference pattern can be formed by a similar process with the C crystal. At this point, Ga or In as an implanted ion, and dry etching gas having $O_2$ as a main component may be used.

The profile of FIB implanted ion concentration in the depth direction is decided according to the species and energy of an ion. For single ionic species, various profiles can be obtained by the changing of accelerating voltage. However, an FIB unit can draw simultaneously a wide variety of ionic species by using various alloy ion sources, and use of a mass filter allows an arbitrary ionic species (atomic species, ionic valence) to be selectively implanted. At this point, a heavy ion whose penetrating depth becomes shallow has an ion concentration peak at a shallow position, while a divalent ion which obtains an energy two times greater than that of a monovalent ion has an ion concentration peak at a deep position.

Figure 3B:
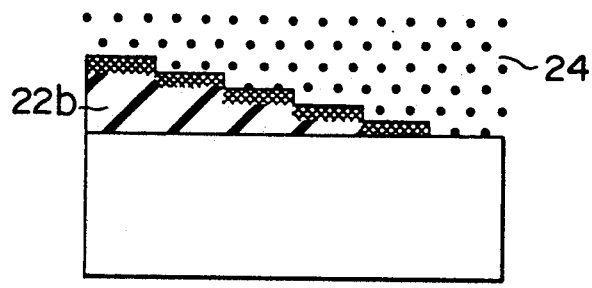
Figure 3C:
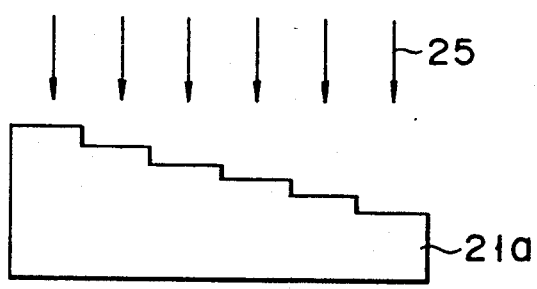

With respect to a method of forming an inclined pattern in connection with a third embodiment of the present invention shown FIGS. 3A through 3C, a $SiN_x$ film 22 with a thickness of approx. 500 nm is formed on an InP substrate 21 by a plasma CVD unit, as shown first in FIG. 3A. Then, a Ga ion 23 focused by an FIB unit is implanted into the $SiN_x$ film 22. In order to form an inclined pattern at this step, the ion implantation is performed by gradually moving an implantation position and stepwise changing an accelerating voltage. When an accelerating voltage is allowed to change in implantation an ion, as shown in FIG. 4, the profile of ion concentration in the depth direction will have a peak at a shallow depth for low acceleration and a peak at a deep depth for high acceleration. This causes, as shown with the crisscross lines in the $SiN_x$ film 22 in FIG. 3A, ion implanted portions 22a to have a distribution with respect to the depth of ion concentration peak position, that is, stepwise distribution. Ion implantation is not performed for a region required to remove all the $SiN_x$ film 22.

Then, the $SiN_x$ film 22 is dry etched by a radical 24 of $CF_4$ gas by the use of a CDE unit as shown in FIG. 3B. when an ion concentration implanted is larger than a certain value, etch rate becomes a very small value, as shown in FIG. 5, which means that a region into which an ion is implanted exceeding a certain threshold becomes an etch stopping layer. Accordingly, the etch stopping layer is stepwise distributed in the $SiN_x$ film 22, whereby the $SiN_x$ film 22 is stepwise etched as shown in FIG. 3B.

Finally, using a stepwise-formed $SiN_x$ film 22b as a mask and using an RIE unit, the InP substrate 21 is dry etched by an ion of $Cl_2$ gas, whereby a stepwise inclined pattern 21a can be formed on the InP substrate 21.

In this embodiment, although a wide step and a large step difference are shown for the convenience to description, the beam diameter of the FIB can be easily contracted to 100 nm or less, and a difference of 2 kV in acceleration voltage allows the ion concentration peak position depth to develop a difference of approx. 1 nm, whereby a very smooth inclined pattern can be formed for ordinary semiconductor devices. With the variation of ion beam implantation position and that of acceleration voltage set properly, a concave or convex spherical surface pattern, a diffraction grating pattern and the like which have no uniform inclination can be freely formed. By changing a parameter such as etching gas pressure, RF power and interelectrode distance, the RIE unit can change the selection ratio between the $SiN_x$ film 22 and the InP substrate 21, whereby a micro step difference of the $SiN_x$ film 22 can be enlarged and transferred to the InP substrate 21. That is, the inclination of an inclined pattern can be freely changed in the process of pattern transfer to substrate, thereby allowing also an inclined pattern with a very sharp inclination to be formed.

It will be appreciated that the method of forming an inclined pattern can be not only utilized for semiconductor substrates, but applied to semiconductor multilayer films, insulators and metals. In particular, the contact hole in PSG used as the insulation film of MOS transistors is preferably an inclined pattern, which can be formed by only three-step process shown in FIGS. 3A through 3C. In a similar manner, a lens formation and the like using SiO can also be completed by a simpler three-step process. Since C crystal can be formed by a vacuum process such as CVD, and has a resistance against ion spattering, it can be used as the mask material for inclined pattern formation as with the above-mentioned embodiments. At this point, Ga or In as an FIB implanted ion, and dry etching gas having $O_2$ as a main component may be used.

The profile of FIB implanted ion concentration in the depth direction is decided according to the species and energy of an ion, and for single ionic species, various profiles can be obtained by the changing of accelerating voltage. However, an FIB unit can draw simultaneously a wide variety of ionic species by using various alloy ion sources, and use of a mass filter allows an arbitrary ionic species (atomic species, ionic valence) to be selectively implanted. At this point, a heavy ion whose penetrating depth becomes shallow has an ion concentration peak at a shallow position, while a divalent ion which obtains an energy two times greater than that of a monovalent ion has an ion concentration peak at a deep position.

Although in the above-mentioned embodiments, an example where the etching of ion implanted region is inhibited, in a word, an example of a negative resist is shown, the resist can also be used as a positive resist by an appropriate selection of ionic species, ion energy and dry etching gas species. For example, when a Ga ion is FIB radiated to a GaAs substrate at an acceleration voltage of 10 kV, and then the substrated is etched with $Cl_2$ gas, the irradiated region indicates an etching rate approx. ten times faster than a non-irradiated region. That is, only the ion irradiated region can be etched and removed, thereby allowing a similar inclined pattern as a positive resist to be formed.

With respect to a method of manufacturing a quantum wire laser in connection with a fourth embodiment of the present invention shown in FIGS. 6A through 6H, in particular here, a method of producing a quantum wire structure of an active layer portion will be described.

First, as shown in FIG. 6A, the crystal growth of an AlGaAs barrier layer 52 is performed on a GaAs based semiconductor multilayer film substrate 51 by the use of an MBE unit.

Then, the substrate is moved by a conveyance in the vacuum to a plasma CVD unit, where a Si nitrided resist 53 with a film thickness of approx. 50 nm is deposited on the barrier layer by a plasma of $SiH_4$ gas, $NH_3$ gas and $N_2$ gas as shown in FIG. 6B.

Then, the substrate is moved by vacuum conveyance to a focused ion beam unit, where it is exposed with a Ga ion beam 54 of 50 nm diameter in a diffraction grating shape with a period 100 nm, thereby causing a Ga injected region 53a to be formed on the Si nitrided resist 53 as shown in FIG. 6C. In the focused ion beam unit, the higher the ion accelerating voltage is, the greater the beam focusing performance becomes, so that a fine ion beam can be obtained, but on the contrary, however, by a cause such as a largely widened implanted ion, the process becomes not always advantageous for a fine region implantation. A beam diameter of approx. 50 nm is sufficiently obtained even at an accelerating voltage of 80 kV, and no problem exists in an ordinary focused ion beam unit for this embodiment. However, where an accelerating voltage is increased to obtain a finer beam, it is preferable to provide a retarding electrode in direct front of a specimen to reduce ion energy while keeping a fine beam.

Then, the substrate is moved by vacuum conveyance to an RIE unit, where a dry etching using a plasma ion 55 of $CF_4$ gas is performed to develop the Si nitride resist 53 as shown in FIG. 6D. The reaction with the fluorine contained in the plasma of $CF_4$ gas causes a nonvolatile Ga fluoride to be formed in a Ga implanted region 53a. In a similar manner, a volatile Si fluoride is formed in a Ga nonimplanted region, where dry etching proceeds. As a result, the Si nitride resist 53 as a negative resist can be patterned in a diffraction grating shape.

Figure 6E:
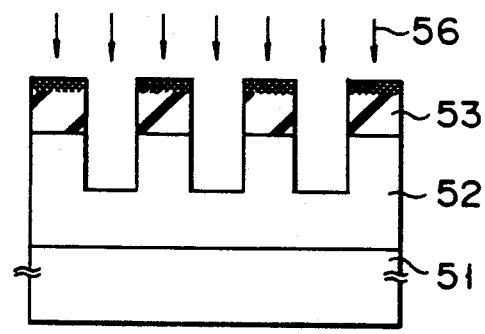

Then, the substrate is moved by vacuum conveyance to an RIBE unit, where a dry etching using a plasma ion 56 of Cl$_2$ gas and Ar gas is performed using the diffraction grating-shape pattern of the Si nitride resist 53 as an etching mask, thereby forming grooves with a depth of 50 nm in the AlGaAs layer 52, as shown in FIG. 6E.

Figure 6F:
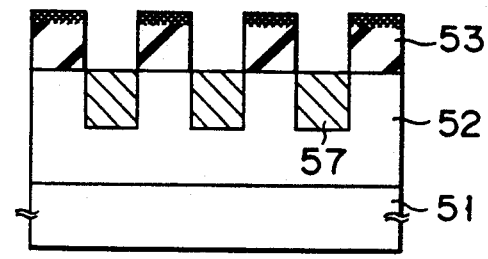

Then, the substrate is moved by vacuum conveyance again to the MBE unit, where a GaAs quantum wire layer 57 is grown in the groove of the AlGaAs barrier layer 52 as shown in FIG. 6F. At this point, selecting the growth condition by the MBE allows a selective growth without crystal growing on the Si nitride resist 53 to be performed.

Figure 6G:
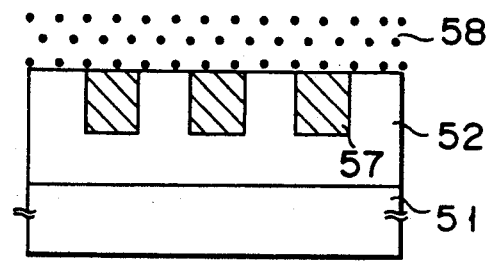
Figure 6H:
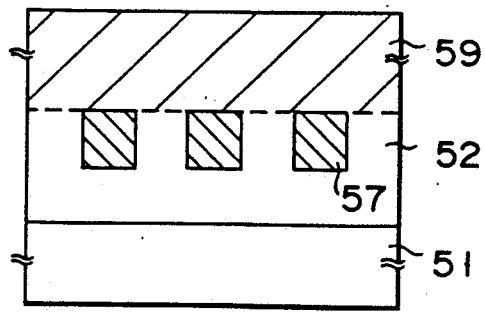

Then, the substrate is moved by vacuum conveyance to an ashing unit, where the Si nitride resist 53 is ashing removed by the use of a CF$_4$ gas plasma 58 as shown in FIG. 6G. Then, the substrate is moved by vacuum conveyance again to the MBE unit, where the regrowth of an AlGaAs barrier layer 59 is performed as shown in FIG. 6H. In this manner, the active layer portion of a GaAs based semiconductor quantum wire laser is completed.

Although in the above-mentioned embodiment, a process utilizing the feature of Si nitride as a selective growth mask is performed, patterning may also be performed after the active layer is grown. That is, by performing processes of Si nitrided resist deposition by plasma CVD, Ga ion beam exposure by FIB implantation, dry development by RIE using CF$_4$, and active layer patterning by RIBE using Cl$_2$ and Ar, instead of processes of PMMA resist coating, electron beam exposure, wet development, and active layer patterning by wet etching of said prior art example by M. Cao et al., a quantum wire laser having a similar structure to said prior art example can be manufactured with a good controllability and without being accompanied by a deteriorated device characteristics.

Thus, a process where patterning is performed after an active layer is grown, and then covering crystal growth is performed can be performed without being accompanied by a deteriorated device characteristics, so that it will be apparent that the present invention may also be applied to the manufacture of an InP based semiconductor quantum wire laser. It will also be apparent that if a diffraction grating-shape patterning is performed two-dimensionally, the present invention may be applied to the manufacture of a quantum box laser.

Further, the point of the present invention is in that a fine lithography is performed using an inorganic Si compound as a resist, and the following semiconductor substrate fabrication and crystal growth can be performed without developing a regrowth interface oxidation and an impurity contamination, so that the application of the present invention is not limited to a semiconductor quantum wire laser, but can be made to various optical devices and electron devices using a microstructure.

Cases where the present invention is applied to various semiconductor devices, as fifth through eleventh embodiments, will be briefly described hereinafter. In each embodiment, the present invention is applied to a process of forming a pattern in devices, detail of which has been apparent by the description of the above-mentioned first through fourth embodiments, and therefore will be omitted.

Figure 7A:
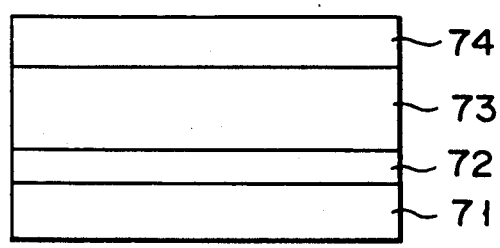
FIGS. 7A through 7C are sectional views showing part of a method of manufacturing a gain coupling type DFB laser in connection with a fifth embodiment of the present invention.
Figure 7B:
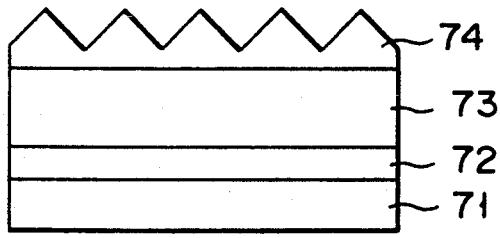
Figure 7C:
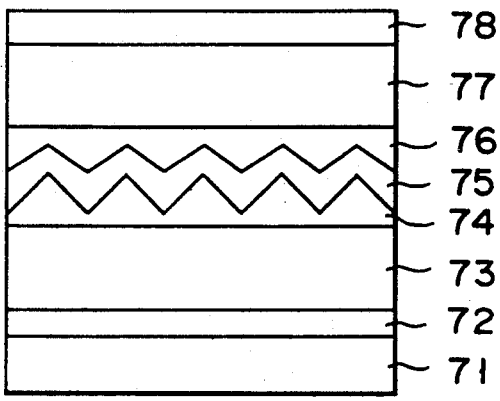

FIGS. 7A through 7C relate to a method of manufacturing a gain coupling DFB laser in connection with a fifth embodiment of the present invention. A process becoming a base of this embodiment is described in the literature by Y. Luo et al., APCT '89 H5.

In order to achieve a gain coupling having a stable single longitudinal mode in this structure, a periodic structure is formed in an active layer's self. The structure is formed in such a manner that a pattern supply layer 74 formed by a first crystal growth through a buffer layer 72 and a cladding layer 73 on a substrate 71 as shown in FIG. 7A is fabricated in a secondary diffraction grating shape with a period 250 nm by the use of interference exposure technique and sulfuric acid wet etching as shown in FIG. 7B. Then, an active layer 75 is allowed to grow on the supply layer by a second crystal growth as shown in FIG. 7C, thereby forming a periodic structure on the active layer.

Using the present invention allows a similar structure to be formed without developing a deteriorated regrowth interface, whereby a gain coupling DFB laser can be manufactured without being accompanied by a lowered quantum efficiency. In addition, the fabrication of the active layer's self in a diffraction grating shape can be performed without being accompanied by a deteriorated active layer, thereby allowing a gain coupling DFB laser to be manufactured in a simpler process.

It will be apparent that the present invention can be applied not only to the manufacture of a gain coupling but to that of a refractive index coupling DFB laser having a periodic structure in only its guide layer. Also, a λ/4 shift structure and a period modulation structure of a diffraction grating can be easily formed to reduce an effect of hole burning in the axis direction. Similarly, it will be also apparent that the present invention can be applied to the manufacture of a DBR laser having a finely periodic structure. The direction of a diffraction grating of DFB laser or DBR laser can be taken without depending on crystal direction, thereby causing an integration with other devices to become easy, and the degree of freedom of future OEIC design to be expanded. In FIG. 7, numeral 76 indicates an active layer, numeral 77 a cladding layer, and numeral 78 a contact layer.

FIGS. 8A through 8C relate to a method of manufacturing a microcavity surface-emitting laser in connection with a sixth embodiment of the present invention. A process becoming a base of this embodiment is described in the literature by K. Iga et al., Electron. Lett. 23, 134 (1987).

Using a SiO$_2$ layer 86 shown in FIG. 8A as a mask, a circular mesa with a 30 μm diameter is formed by wet etching as shown in FIG. 8B, and then an active region 83 to be buried with a 6 μm diameter is formed by a selective meltback using LPE as shown in FIG. 8C.

It is important for a microcavity surface-emitting laser not to deteriorate the regrowth interface to be buried. Using the present invention allows the formation and burying of a microcavity to be performed in a simple process without a concern over an interface deterioration.

In the above-mentioned devices, a selective meltback using LPE is used to form a microactive region, and limited to burying by a p-n-p current blocking layer, while using the present invention allows a high-resistance burying by MBE or MOCVD, and an improvement of device performance to be expected. It will be also apparent that a submicron diameter device capable of exhibiting an essential high-performance as a microcavity can be easily formed. In FIGS. 8A through 8C, numeral 81 indicates a GaAs substrate, numeral 82 an n-cladding layer, numeral 84 a p-cladding layer, and numeral 85 a cap layer.

FIGS. 9A and 9B relate to a three-dimensionally periodic dielectric structure in connection with a seventh embodiment of the present invention. A technique becoming a base of this embodiment is described in the literature by E. Yablonovitch, Phys. Rev. Lett. 58, 2059 (1987).

By such structure, spontaneous emission can be confined to achieve a high performance of semiconductor lasers. Since the magnitude of a basic unit of the structure can be expressed by $\lambda/2\,(n_1+n_2)$ in which $\lambda$ is the wavelength of light and $n_1$ and $n_2$ refractive indexes of two-kind dielectric mediums as shown in FIG. 9A, a submicron microfabrication becomes necessary.

The structure can be obtained by perforating checkerwise a substrate as shown in FIG. 9A, and by holding an active layer 93 in the course of the alternate crystal growth of a medium 91 with a refractive index $n_1$ and a medium 92 with a refractive index $n_2$ on the substrate as shown in FIG. 9B, while using the present invention allows a microcheckers to be fabricated without deteriorating a regrowth interface, thereby manufacturing a three-dimensionally periodic dielectric structure in conformance to design.

FIG. 10 relates to a quantum wire photodetector device in connection with an eighth embodiment of the present invention. A technique becoming a base of this embodiment is described in the literature by D. L. Crawford et al., CLEO 90 CTHQ4.

Although by such structure, an increased absorption efficiency and electron mobility can be expected by the achievement of a quantum wire 33a of a light absorption layer 33, where an interface is deteriorated at the time of microfabrication and regrowth, on the contrary, the absorption efficiency or mobility is reduced to cause an expected performance not to be obtained. In FIG. 10, numeral 31 indicates a substrate, numeral 32 an n-contact layer, and numeral 34 a p-contact layer. According to the present invention, those problems can be avoided to produce a high-speed quantum wire photodetector device FIG. 11 relates to an A-B effect device being a kind of a mesoscopic device in connection with a ninth embodiment of the present invention.

Although this device has a structure in which a ring-shape wire of a GaAs 37 is buried in an AlGaAs 36, the conductance of a two-dimensional electron gas occurring on the interface between AlGaAs and GaAs changes according to an electric field applied to an electrode 38 behind one side of the ring, thereby resulting in an interference of electron wave. A ring diameter of 1 μm or less is required to cause the interference, and where there is a deterioration on the interface between AlGaAs and GaAs, a sufficient characteristics is not exhibited. Using the present invention allows a micro ring-shape buried structure to be produced without problem, whereby the feature of the A-B effect device can be sufficiently drawn.

Figure 12:
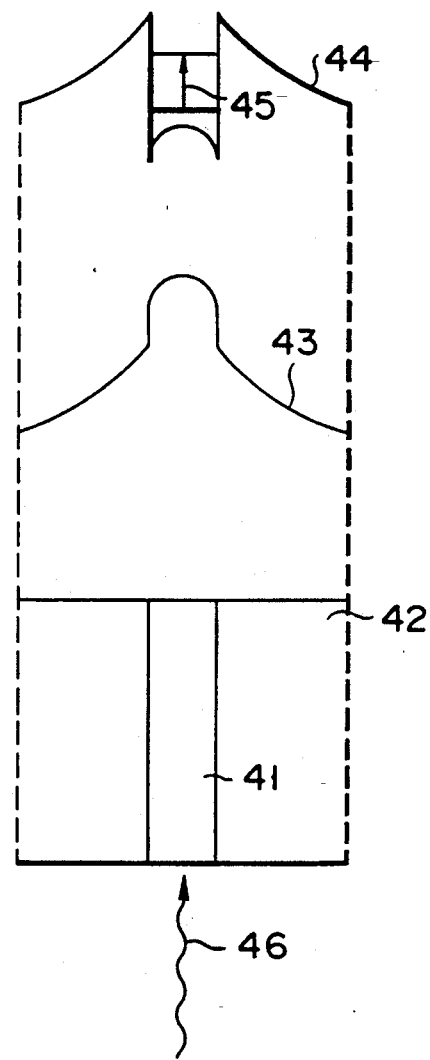
FIG. 12 is a view to help explain a concept of a far infrared photodetector device in connection with a tenth embodiment of the present invention.

FIG. 12 relates to a far infrared photodetector device in connection with a tenth embodiment of the present invention. In FIG. 12, numeral 41 indicates a GaAs quantum well layer, numeral 42 an AlGaAs barrier layer, and numeral 43 a valence band.

The modulation-doped GaAs/AlGaAs quantum well structure has an intersubband transition 45 of conductive band 44 corresponding to a light wavelength of 10 μm band, and its light absorption occurs only when the electric field of an irradiated light 46 is in the vertical direction to the quantum well interface. Accordingly, with an ordinary quantum well structure, a photodetector device having an irradiated light vertical to the surface utilizing an intersubband transition cannot be produced. Although the problem may be solved by the use of a quantum wire or quantum box structure, where there is an interface deterioration accompanying fabrication and regrowth, a sufficient characteristics will not be obtained. According to the present invention, a quantum wire or quantum box structure can be formed without a concern over an interface deterioration, thereby allowing a far infrared photodetector device with a wide variety of applications.

Figure 13:
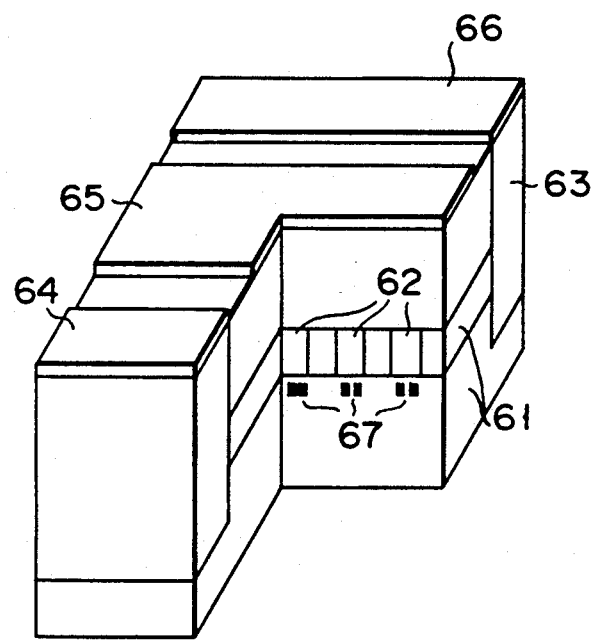
FIG. 13 is a typical view of a quantum wire FET in connection with an eleventh embodiment of the present invention.

FIG. 13 relates to a quantum wire FET in connection with an eleventh embodiment of the present invention. A technique becoming a base of this embodiment is described in the literature by K. Tsubaki et al., Electron. Lett. 24, 1267 (1988).

In FIG. 13, numeral 61 indicates a GaAs layer, numeral 62 an AlAs layer, numeral 63 a Si dope AlGaAs region, numeral 64 a source electrode, numeral 65 a gate electrode, numeral 66 a drain electrode, and numeral 67 an electron. Although this structure is such that a quantum wire produced utilizing a fractional layer superlattice is incorporated into an ordinary HEMT, a transconductance several times larger than for a prior art HEMT is obtained by a one-dimensional confinement effect. Using the present invention allows a quantum wire structure independent of crystal direction to be easily formed, whereby a similar quantum wire can be manufactured in a shape suitable for achieving integration.

A silicon compound mentioned in the present invention employs suitably silicon oxide, silicon nitride, SiC, Si-Ge, and the like, and can be also obtained by the use of poly-silicon, amorphous silicon, and the like.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of forming a pattern in semiconductor device manufacturing process comprising the steps of:
   implanting ions into a film to be etched to form a plurality of high-ion concentration regions having different depths from a top surface of said film; and
   etching said film from said surface using said high-ion concentration regions as an etching inhibition regions to form a step difference pattern on said film.

2. A method according to claim 1, wherein the step of implanting said ions into said film is performed by changing the implantation position of a focussed ion beam and by changing at least one parameter among accelerating voltage, atomic species of ion, and ionic valence.

3. A method according to claim 1, wherein the step of etching said film is performed by dry etching.

4. A method according to claim 3, wherein said film consists of a silicon nitride film or a silicon oxide film, said ions consist of Ga or In, and said etching is performed by an etching gas containing F.

5. A method according to claim 1, wherein said each step is performed in a highly pressure reduced atmosphere, and the transfer of the resulting structures between said steps is performed in a highly pressure reduced atmosphere.

6. A method of forming a pattern in a semiconductor device manufacturing process, comprising the steps of:
   implanting atoms of Ga or In by a focused ion beam into a selected region of a thin film consisting of silicon or its compound under a highly pressure-reduced atmosphere, said selected region defining a pattern to be formed; and
   etching said thin film by dry etching with an etching gas containing F atoms, while allowing said F atoms to react with said implanted atoms in said selected region in order to form a fluoride thereof, and using said selected region containing said fluoride as an etching inhibition region.

7. A method according to claim 6, wherein said step of etching is performed in a highly pressure-reduced atmosphere, and the transfer of the resulting structures between said steps is performed in a highly pressure-reduced atmosphere.

8. A method according to claim 6, wherein said implanted atoms consist of Ga.

9. A method according to claim 8, wherein said thin film consists of silicon nitride or silicon oxide.

10. A method according to claim 9, wherein said etching gas consists of $CF_4$.

11. A method according to claim 6 consisting essentially of the steps of:
    implanting atoms of Ga or In by a focused ion beam into a selected region of a thin film consisting of silicon or its compound under a highly pressure-reduced atmosphere, said selected region defining a pattern to be formed; and
    etching said thin film by dry etching with an etching gas containing F atoms, while allowing said F atoms to react with said implanted atoms in said selected region in order to form a fluoride thereof, and using said selected region containing said fluoride as an etching inhibition region.

12. A method according to claim 6 wherein said implanted atoms consist of In.

13. A method of forming a pattern in a semiconductor device manufacturing process, comprising the steps of:
    forming a thin film consisting of silicon or its compound on a compound semiconductor substrate;
    implanting atoms of Ga or In by a focused ion beam into a selected region of a thin film, said selected region defining a pattern to be formed;
    etching said thin film by dry etching with an etching gas containing F atoms, while allowing said F atoms to react with said implanted atoms in said selected region in order to form a fluoride thereof, and using said selected region containing said fluoride as an etching inhibition region; and
    dry etching said compound semiconductor substrate using the etched pattern of said thin film as a mask;
    wherein each of said steps is performed in a highly pressure-reduced atmosphere and the transfer of the resulting structures between said steps is performed in a highly pressure-reduced atmosphere.

14. A method according to claim 13, wherein said implanted atoms consist of Ga.

15. A method according to claim 14, wherein said thin film consists of silicon nitride or silicon oxide.

16. A method according to claim 15, wherein said etching gas consists of $CF_4$.

17. A method according to claim 17 consisting essentially of the steps of:
    forming a thin film consisting of silicon or its compound on a compound semiconductor substrate;
    implanting atoms of Ga or In by a focused ion beam into a selected region of a thin film, said selected region defining a pattern to be formed;
    etching said thin film by dry etching with an etching gas containing F atoms, while allowing said F atoms to react with said implanted atoms in said selected region in order to form a fluoride thereof, and using said selected region containing said fluoride as an etching inhibition region; and
    dry etching said compound semiconductor substrate using the etched pattern of said thin film as a mask;
    wherein each of said steps is performed in a highly pressure-reduced atmosphere and the transfer of the resulting structures between said steps is performed in a highly pressure-reduced atmosphere.

18. A method according to claim 17 wherein said implanted atoms consist of In.

19. A method according to claim 13, wherein said method further comprises a step of performing a crystal growth on said compound semiconductor substrate using said mask as a mask for selective growth.

20. A method according to claim 13, wherein said method further comprises steps of removing said mask and performing crystal growth on said compound semiconductor substrate.

* * * * *